United States Patent
Gu et al.

(10) Patent No.: US 9,337,278 B1
(45) Date of Patent: May 10, 2016

(54) GALLIUM NITRIDE ON HIGH THERMAL CONDUCTIVITY MATERIAL DEVICE AND METHOD

(71) Applicant: TriQuint Semiconductor, Inc., Hillsboro, OR (US)

(72) Inventors: Xing Gu, Plano, TX (US); Jinqiao Xie, Allen, TX (US); Edward A. Beam, III, Plano, TX (US); Deep C. Dumka, Richardson, TX (US); Cathy C. Lee, Allen, TX (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 0 days.

(21) Appl. No.: 14/631,677

(22) Filed: Feb. 25, 2015

(51) Int. Cl.
| | | |
|---|---|---|
| *H01L 21/338* | (2006.01) | |
| *H01L 21/337* | (2006.01) | |
| *H01L 21/336* | (2006.01) | |
| *H01L 31/072* | (2012.01) | |
| *H01L 29/739* | (2006.01) | |
| *H01L 29/20* | (2006.01) | |
| *H01L 29/205* | (2006.01) | |
| *H01L 29/778* | (2006.01) | |
| *H01L 23/367* | (2006.01) | |
| *H01L 23/373* | (2006.01) | |
| *H01L 21/02* | (2006.01) | |
| *H01L 29/66* | (2006.01) | |
| *H01L 23/00* | (2006.01) | |
| *H01L 21/48* | (2006.01) | |

(52) U.S. Cl.
CPC ........ *H01L 29/2003* (2013.01); *H01L 21/0254* (2013.01); *H01L 21/4803* (2013.01); *H01L 23/367* (2013.01); *H01L 23/3732* (2013.01); *H01L 24/32* (2013.01); *H01L 24/83* (2013.01); *H01L 29/205* (2013.01); *H01L 29/66462* (2013.01); *H01L 29/7787* (2013.01); *H01L 2224/32225* (2013.01); *H01L 2224/83192* (2013.01)

(58) Field of Classification Search
CPC ............... H01L 29/2003; H01L 29/66462; H01L 29/42316; H01L 29/7783; H01L 29/66431; H01L 29/802; H01L 29/7788; H01L 29/432; H01L 2924/13064; H01L 29/66318
USPC .......... 257/189, 192, 194, 196; 438/172, 191, 438/285, 604
See application file for complete search history.

(56) References Cited

U.S. PATENT DOCUMENTS

2014/0253241 A1* 9/2014 Lee ......................... H03F 3/193
330/277

OTHER PUBLICATIONS

Gao, Y., et al., "Etched Aperture GaN Cavet Through Photoelectrochemical Wet Etching," International Journal of High Speed Electronics and Systems, vol. 14, No. 1, 2004, pp. 245-264.

* cited by examiner

*Primary Examiner* — Hsien Ming Lee
(74) *Attorney, Agent, or Firm* — Withrow & Terranova, P.L.L.C.

(57) ABSTRACT

Embodiments include but are not limited to semiconductor devices including a barrier layer, a gallium nitride channel layer having a Ga-face coupled with the barrier layer, and a thermoconductive layer having a thermal conductivity of at least 500 W/(m·K) within 1000 nanometers of a Ga-face of the gallium nitride channel layer. The semiconductor device may be a high-electron-mobility transistor or a semiconductor wafer. Methods for making the same also are described.

23 Claims, 5 Drawing Sheets

FIG. 5

GALLIUM NITRIDE ON HIGH THERMAL CONDUCTIVITY MATERIAL DEVICE AND METHOD

TECHNICAL FIELD

Embodiments of the present disclosure relate generally to gallium nitride (GaN) semiconductor devices and methods, and more particularly to GaN on high thermal conductivity material high electron mobility transistors (HEMTs).

BACKGROUND

In the current state of GaN semiconductor devices, the standard approach toward making GaN devices such as HEMTs, on a high thermal conductivity substrate (e.g., with thermal conductivity higher than silicon carbide (SiC)) has multiple limitations. The standard approach typically starts with a Ga-polar GaN device structure grown on Si-face SiC or a Si (111) substrate that is then flip-chip surface mounted to a carrier wafer. The SiC or Si substrate and part of a GaN buffer layer is then mechanically or chemically removed and replaced by a high thermal conductivity substrate such as diamond. The standard approach typically uses surface bonding to a carrier wafer that generates surface contamination that increases the possibility of high gate leakage current and large current collapse. The standard approach typically removes a substrate and a GaN buffer to expose the highly chemically active N-face of GaN to processing, which can lead to increased buffer leakage and reduced breakdown voltage. This may, in turn, limit the operation voltage of the device and its radio-frequency (RF) performance. The standard approach may also use a considerably thick GaN buffer layer that is retained due to process control limitations, which increases the distance between a junction of the device and the high thermal conductivity substrate which compromises the thermal dissipation performance of the device. The substrate is also typically attached to the active wafer by using an interfacial adhesive material with a significantly low thermal conductivity, which increases the thermal resistance of the device significantly.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION OF EMBODIMENTS OF THE INVENTION

Embodiments of the present disclosure describe gallium nitride (GaN) semiconductor devices and methods, and more particularly GaN on high thermal conductivity material high electron mobility transistors (HEMTs). In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent. Moreover, some embodiments may include more or fewer operations than may be described.

The description may use the phrases "in an embodiment," "in embodiments," "in some embodiments," or "in various embodiments," which may each refer to one or more of the same or different embodiments. Furthermore, the terms "comprising," "including," "having," and the like, as used with respect to embodiments of the present invention, are synonymous.

The phrase "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

The phrase "formed on," along with its derivatives, may be used herein. "Formed on" in the context of a layer being "formed on" another layer may mean that a layer is formed above, but not necessarily in direct physical or electrical contact with, another layer (e.g., there may be one or more other layers interposing the layers). In some embodiments, however, "formed on" may mean that a layer is in direct physical contact with at least a portion of a top surface of another layer. Usage of terms like "top" and "bottom" are to assist in understanding, and they are not to be construed to be limiting on the disclosure.

The term "active surface" as used herein may refer to the surface of a die having the active regions/areas, as is known to those having skill in the art. The active surface of a die may include any one or more of various circuitry components, such as transistors, memory cells, passive components, and the like.

For the purposes of the present invention, the phrases "A or B" and "A and/or B" mean (A), (B), or (A and B).

Figure 1:
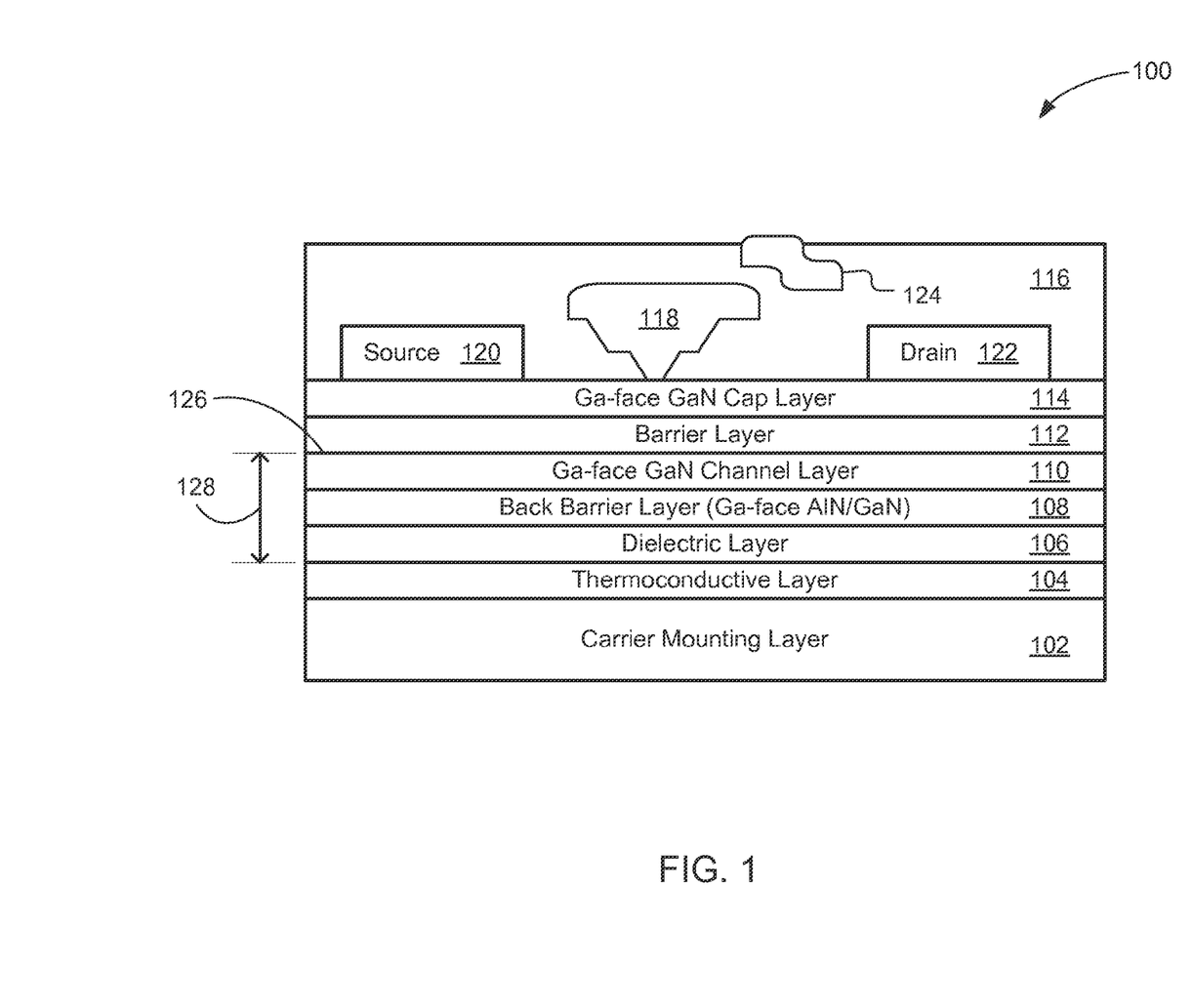
FIG. 1 illustrates a cross-sectional view of a semiconductor device in accordance with various embodiments.

A cross-sectional side view of an example semiconductor device 100 is illustrated in FIG. 1. As illustrated, the semiconductor device 100 (also referred to as "device 100") may include a Ga-face wafer stack including a carrier mounting layer 102, a thermoconductive layer 104, a dielectric layer 106, a back barrier layer 108 that may be a Ga-face aluminum nitride (AlN)/GaN layer or an aluminum gallium nitride (AlGaN) alloyed layer with Al composition from 1 to 100% in various embodiments, a Ga-face GaN channel layer 110, a barrier layer 112, and a Ga-face GaN cap layer 114. In embodiments, the barrier layer 112 may be a Ga-face AlGaN layer, an indium aluminum nitride (InAlN) layer, or a related alloy layer. In embodiments, the back barrier layer 108 may include at least one AlN layer and at least one GaN layer, or an AlGaN alloyed layer with Al composition from 1 to 100%. In some embodiments, the back barrier layer 108 may include a plurality of AlN layers and a plurality of GaN layers arranged in an alternating fashion. An activation layer 116 may be formed on the Ga-face GaN cap layer 114 in various embodiments and include a material such as silicon nitride (SiN). In embodiments, Ga-face layers of the Ga-face wafer stack may have a Ga-face that faces away from the carrier mounting layer 102 toward the activation layer 116. The activation layer 116 may include a gate 118, a source 120, and a drain 122 in various embodiments. The activation layer 116 may also include a field plate 124. In embodiments, a two dimensional electron gas (2DEG) region 126 may be formed at an interface of the Ga-face GaN channel layer 110 and the barrier layer 112 from polarization and piezoelectric strain effects between these layers. The thermoconductive layer 104 may be within a distance 128 of 5 to 1000 nanometers (nm) from the 2DEG region 126 in various embodiments.

In various embodiments, one or more of the layers, such as the carrier mounting layer 102, the dielectric layer 106, the back barrier layer 108, or the Ga-face GaN cap layer 114 may not be present. In embodiments, the thermoconductive layer 104 has a thermal conductivity, k value, of at least 500 watts per meter kelvin (W/(m·K)). The thermoconductive layer 104 may be a layer formed of diamond, boron nitride, graphene, graphite, or cubic boron arsenide in various embodiments. The carrier mounting layer 102 may have a similar thermal conductivity and composition as the thermoconductive layer 104 in various embodiments.

In embodiments, the device 100 includes an activation layer that is used in a high-electron-mobility transistor (HEMT). In other embodiments, differing types of activation layers for other device types may be used. In embodiments, an activation layer may not be present, with the device 100 being a multilayer wafer semiconductor component for use in later fabrication processes.

Figure 2:
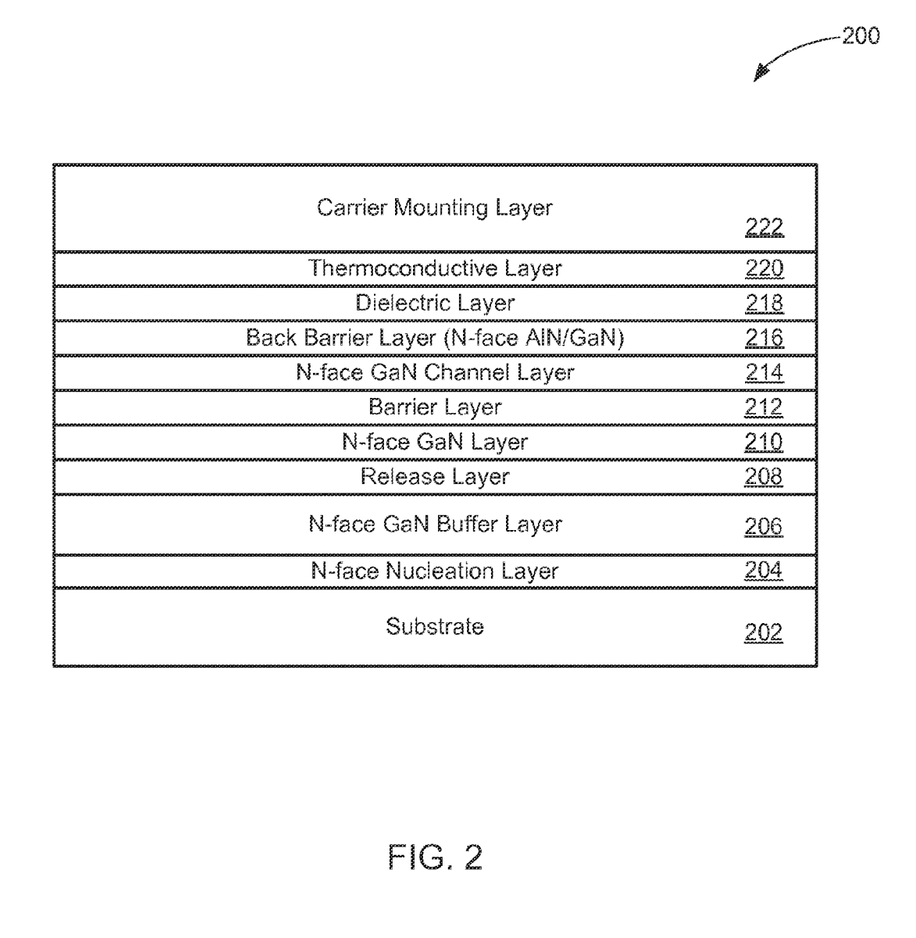
FIG. 2 illustrates a cross-sectional view of a multilayer wafer formed in accordance with various embodiments.

FIG. 2 illustrates a cross-sectional view of an N-face wafer stack 200 in accordance with various embodiments. The N-face wafer stack 200 may include a substrate 202, an N-face nucleation layer 204, an N-face GaN buffer layer 206, a release layer 208, an N-face GaN layer 210, a barrier layer 212, an N-face GaN channel layer 214, a back barrier layer 216, that may be an N-face AlN/GaN layer in various embodiments, a dielectric layer 218, a thermoconductive layer 220, and a carrier mounting layer 222. In embodiments, the barrier layer 212 may be an N-face barrier layer such as an N-face AlGaN layer, an N-face InAlN layer, or a related alloy layer. In embodiments, the back barrier layer 216 may include at least one N-face AlN layer and at least one N-face GaN layer. In some embodiments, the back barrier layer 216 may include a plurality of N-face AlN layers and a plurality of N-face GaN layers arranged in an alternating fashion, or an N-face AlGaN alloyed layer with Al composition from 1 to 100%. In embodiments, N-face layers of the N-face wafer stack 200 may have an N-face that faces away from the substrate 202. In various embodiments, one or more of the layers, such as the release layer 208, the N-face GaN layer 210, the back barrier layer 216, the dielectric layer 218, or the carrier mounting layer 222, may not be present.

In embodiments, the substrate 202 may be a C-face silicon carbide (SiC) substrate, but other materials such as N-face GaN, N-face AlN, silicon, or sapphire may also be used. The release layer 208 may be an indium gallium nitride (InGaN) layer having a thickness of approximately 10 nm to 100 nm and a composition of approximately 1% to 100% indium (In)

in various embodiments. The dielectric layer 218 may range in thickness from approximately 0 nm to 50 nm in various embodiments and may be formed of a material such as AlN. Other materials may be used for the release layer 208 or the dielectric layer 218 in other embodiments.

Figure 3:
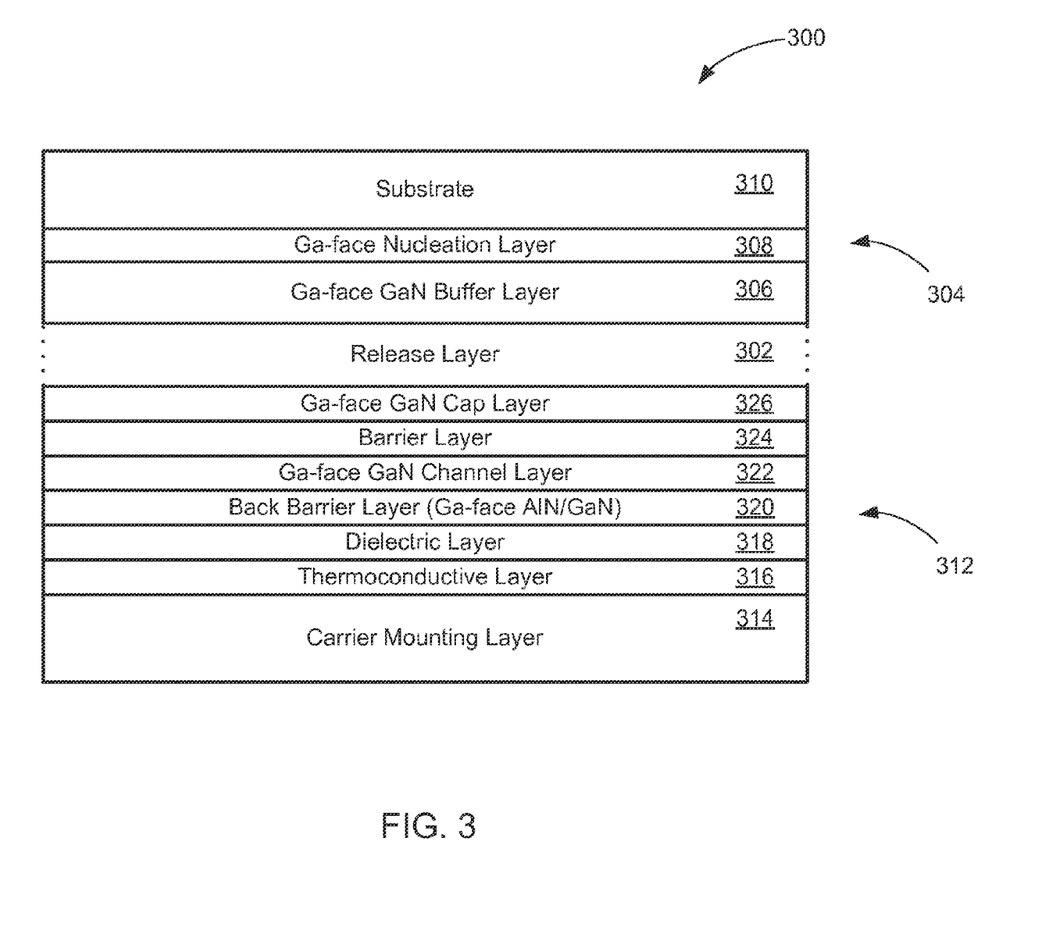
FIG. 3 illustrates a cross-sectional view of a multilayer wafer formed in accordance with various embodiments.

FIG. 3 illustrates a cross-sectional view of a Ga-face wafer stack 300 in accordance with various embodiments. The Ga-face wafer stack 300 may be a flipped N-face wafer stack 200 as described with respect to FIG. 2, in various embodiments. As shown, the Ga-face wafer stack 300 includes a release layer 302 partially etched to remove the release layer 302, a substrate 310, and a buffer stack 304 that may include a Ga-face GaN buffer layer 306 and a Ga-face nucleation layer 308. In embodiments, Ga-face layers of the Ga-face wafer stack 300 may have a Ga-face that faces toward the substrate 310. After removal of the release layer 302, the substrate 310, and the buffer stack 304, a Ga-face GaN wafer stack 312 remains. The Ga-face GaN wafer stack 312 may include a carrier mounting layer 314, thermoconductive layer 316, dielectric layer 318, back barrier layer 320, that may be a Ga-face AlN/GaN layer in various embodiments, Ga-face GaN channel layer 322, barrier layer 324, and Ga-face GaN cap layer 326. In embodiments, the back barrier layer 320 may include at least one AlN layer and at least one GaN layer. In some embodiments, the back barrier layer 320 may include a plurality of AlN layers and a plurality of GaN layers arranged in an alternating fashion. In embodiments, the back barrier layer 320 may include an N-face AlGaN alloyed layer with Al composition from 1 to 100%. In various embodiments, the barrier layer 324 may be a Ga-face barrier layer, such as a Ga-face AlGaN layer. In embodiments where the barrier layer 324 is formed of a material such as InAlN that does not contain Ga, the barrier layer 324 may be other than a Ga-face barrier layer. In various embodiments, one or more of the layers, such as the back barrier layer 320, may not be present. In embodiments, Ga-face layers of the Ga-face GaN wafer stack 312 may have a Ga-face that faces away from the carrier mounting layer 314. In embodiments, the Ga-face GaN wafer stack 312 corresponds to the portion of the device 100 below the activation layer 116 as shown in FIG. 1, with layers 102, 104, 106, 108, 110, 112, and 114 corresponding to layers 314, 316, 318, 320, 322, 324, and 326, respectively.

In embodiments, layers 310, 308, 306, 302, 326, 324, 322, 320, 318, 316, and 314 of the wafer stack 300 may correspond to layers 202, 204, 206, 208, 210, 212, 214, 216, 218, 220, and 222, respectively, of the wafer stack 200. Accordingly, their characteristics and whether a given layer may not be present in some embodiments will not be further described as these matters have been discussed with respect to FIG. 2.

Figure 4:
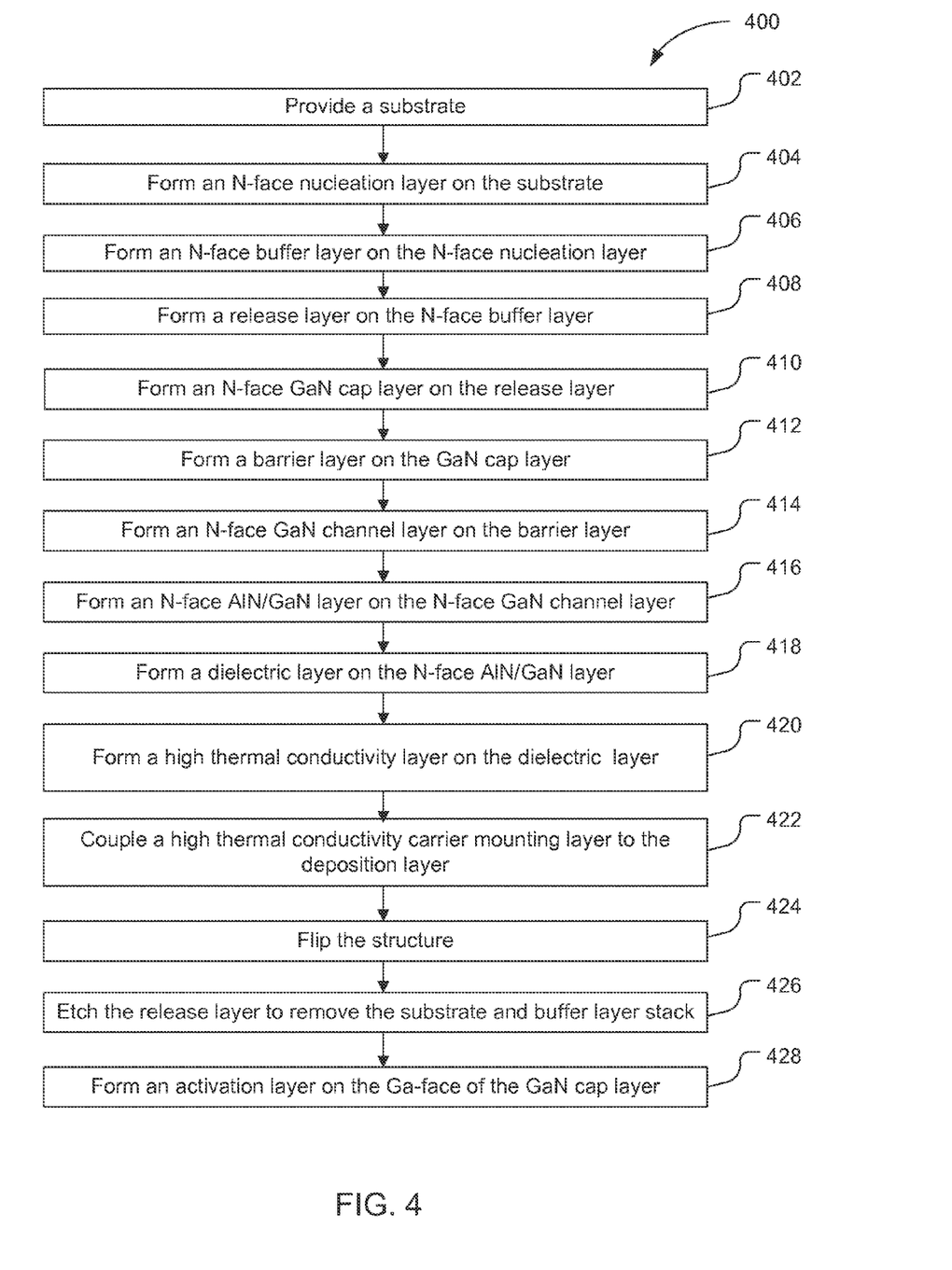
FIG. 4 is a flow diagram of a method for fabricating a semiconductor device in accordance with various embodiments.

FIG. 4 illustrates a flow diagram of a method 400 for fabricating a semiconductor device such as the device 100 in accordance with various embodiments. In embodiments, various layers may be formed or grown, such as by using molecular beam epitaxy (MBE) or metal organic chemical vapor deposition (MOCVD), for example. In embodiments, some layers may be coupled with other layers using other methods, such as a bonding process for example. Generally, in embodiments, an inverted N-face GaN epitaxial structure may be used as a starting material with a high thermal conductivity material such as diamond deposited or bonded to a front side of the epitaxial structure, in an N-face GaN approach to fabricating the device. In embodiments, this allows the high thermal conductivity material to be made very close to a junction of the device, leading to a reduction in thermal resistance in comparison to devices produced by previous methods, and may increase power handling capability. The N-face GaN approach also may protect the N-face GaN from harsh processing operations in comparison to previous methods, resulting lower buffer leakage.

At a block 402, a substrate, such as substrate 202 or 310 may be provided. In embodiments, the substrate may be C-face SiC, N-face GaN, N-face AlN, silicon, sapphire, or another substrate. At operation 404, an N-face nucleation layer, such as the N-face nucleation layer 204, may be formed on the substrate. At a block 406, an N-face buffer layer, such as the N-face GaN buffer layer 206, may be formed on the N-face nucleation layer. At operation 408, a release layer, such as the release layer 208 or 302, may be formed on the N-face buffer layer. In embodiments, the release layer may include InGaN or InGaN-based multiple quantum wells. At a block 410, an N-face GaN cap layer, such as the N-face GaN layer 210, may be formed on the release layer. At operation 412, a barrier layer, such as the barrier layer 212 that may be an N-face barrier layer such as an N-face AlGaN layer in various embodiments, may be formed on the GaN cap layer. In embodiments, the barrier layer may be formed on or coupled with a different layer, such as with the release layer if the GaN cap layer is not included or with the N-face buffer layer if both the GaN cap layer and the release layer are not included, for example. At a block 414, an N-face GaN channel layer, such as the N-face GaN channel layer 214, may be formed on the barrier layer such that a Ga-face of the N-face GaN channel layer is coupled with the barrier layer. Generally, in embodiments, operations performed at the blocks 404-414 may include growth of an epitaxial layer stack using a growth technique such as MBE or MOCVD, for example. At operation 416, a back barrier layer such as the back barrier layer 216 that may be an AlGaN layer or an AlN/GaN layer, such as an N-face AlN/GaN layer, may be formed on the N-face GaN channel layer. In embodiments, the N-face AlN/GaN layer may be deposited in-situ to protect the N-face GaN material from exposure to air. In embodiments, the back barrier layer may be formed by forming at least one AlN layer and at least one GaN layer, with some embodiments forming the back barrier layer by forming a plurality of AlN layers and a plurality of GaN layers in an alternating fashion.

At a block 418, a dielectric layer, such as the dielectric layer 218, may be formed on the N-face AlN/GaN layer. At operation 420, a high thermal conductivity layer, such as the thermoconductive layer 220, may be formed on the dielectric layer. The high thermal conductivity layer may be formed by deposition, or alternatively may be placed on the epitaxial stack by bonding, in various embodiments. In embodiments, the high thermal conductivity layer may be grown by chemical vapor deposition (CVD) and may have a thickness between approximately 1 micrometers ($\mu m$) and 100 $\mu m$. In embodiments, the high thermal conductivity layer may be formed on or coupled with the back barrier layer if the dielectric layer is not included or the N-face GaN channel layer if both the dielectric layer and the back barrier layer are not included. At a block 422, a high thermal conductivity carrier mounting layer, such as the carrier mounting layer 222, may be coupled with the high thermal conductivity layer. In embodiments, the high thermal conductivity layer may have a thickness such as approximately 100 $\mu m$ (or greater) such that the carrier mounting layer is not used.

At operation 424, the wafer structure formed by the preceding operations may be flipped. In embodiments, the high thermal conductivity carrier mounting layer is now the substrate, with the overlying GaN/AlGaN material having Ga-face polarity facing upward. The original substrate may now be on the top of the structure. At a block 426, the release layer may be etched to remove the substrate and buffer layer stack and expose a Ga-face of the GaN cap layer. In embodiments, a photo-assisted electrochemical wet etch may be applied to etch the release layer to remove the substrate and buffer layer stack. After lift-off of the substrate and buffer layer stack, a thin GaN layer formed at the block 410 may be present on the top of the structure that may prevent the AlGaN layer from oxidation, followed by the AlGaN layer formed at operation 412 and the GaN channel layer formed at the block 414. A 2DEG may be formed at the interface between the AlGaN layer and the GaN channel layer due to spontaneous polarization and piezoelectric polarization. The high thermal conductivity layer and high thermal conductivity carrier mounting layer may be below, and may be separated from the layers above by only a thin dielectric transition layer formed at the block 418 in various embodiments. At operation 428, an activation layer, such as the activation layer 116, may be formed on the Ga-face of the GaN cap layer.

As discussed with respect to FIG. 2, one or more of the layers of the process 400 may not be formed in various embodiments, such as the release layer, the N-face GaN layer, the back barrier layer, the dielectric layer, or the carrier mounting layer, for example. Accordingly, one or more of the operations of the process 400 may not be performed, such as forming an N-face GaN cap layer at the block 410, forming the back barrier layer at operation 416, forming the dielectric layer at the block 418, or coupling a high thermal conductivity carrier mounting layer to the thermoconductive layer at the block 422, for example. In such embodiments, subsequent layers described as being formed on or coupled with a particular layer with respect to the process 400 may be formed on or coupled with a different layer when the layer to which they are described as being formed on or coupled with was not formed. In embodiments, layers formed during the process 400 may be coupled directly with the layer they are formed on or bonded with.

Figure 5:
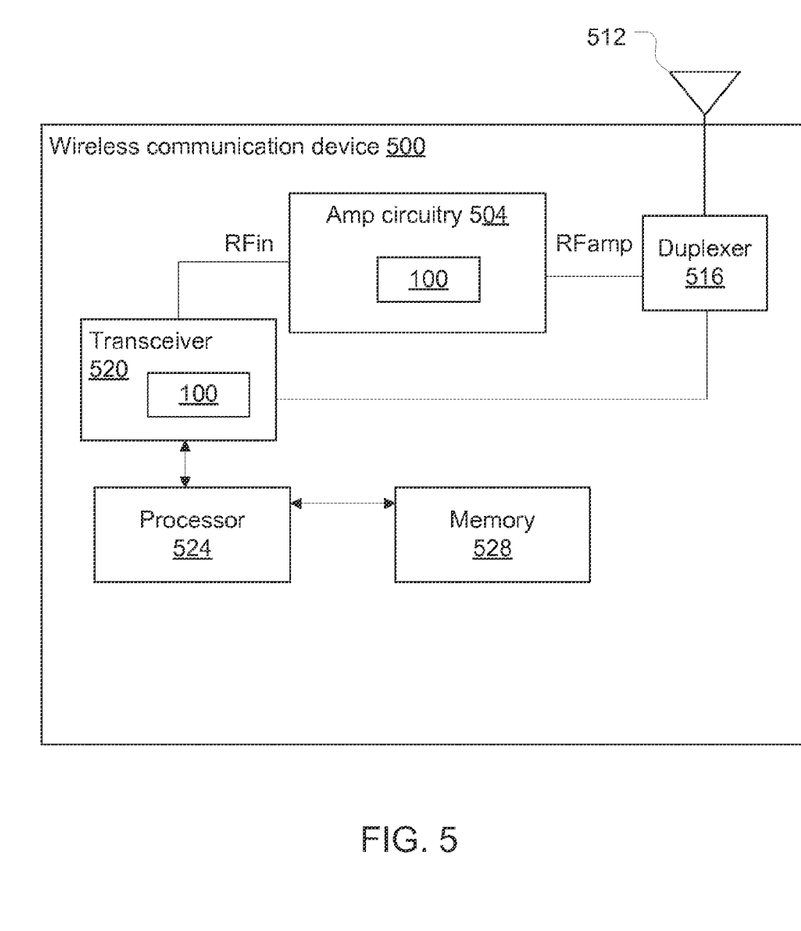
FIG. 5 illustrates a block diagram of a system incorporating a semiconductor device, such as, for example, the semiconductor device illustrated in FIG. 1 in accordance with various embodiments.

The device 100 may be incorporated into any of a variety of apparatuses and systems. The device 100 may be used as a discrete transistor, included in a switch or amplifier, or be included as part of a monolithic microwave integrated circuit (MMIC), for example. A block diagram of an exemplary wireless communication device 500 incorporating device 100 is illustrated in FIG. 5. The wireless communication device 500 may include amplification circuitry 504, antenna structure 512, a duplexer 516, a transceiver 520, a processor 524, and a memory 528 coupled with each other at least as shown. The wireless communication device 500 may include the device 100 incorporated into one or more of the components such as, but not limited to, amplification circuitry 504, or transceiver 520. While the wireless communication device 500 is shown with transmitting and receiving capabilities, other embodiments may include wireless communication devices without receiving or transmitting capabilities.

In various embodiments, the wireless communication device 500 may be, but is not limited to, a mobile phone, a paging device, a personal digital assistant, a text-messaging device, a portable computer, a desktop computer, a telecommunications base station, a subscriber station, an access point, a radar, a satellite communication device, or any other device capable of wirelessly transmitting radio-frequency (RF) signals.

The processor 524 may execute a basic operating system program, stored in the memory 528, in order to control the overall operation of the wireless communication device 500. For example, the processor 524 may control the reception of signals and the transmission of signals by transceiver 520. The processor 524 may be capable of executing other processes and programs resident in the memory 528 and may move data into or out of memory 528, as desired by an executing process.

The transceiver 520 may receive outgoing data (e.g., voice data, web data, e-mail, signaling data, etc.) from the processor 524, may generate an RFin signal to represent the outgoing data, and provide the RFin signal to the amplification circuitry 504.

The amplification circuitry 504 may amplify the RFin signal in accordance with a selected amplification mode. The amplified RFamp signal may be forwarded to the duplexer 516 and then to the antenna structure 512 for an over-the-air (OTA) transmission.

In a similar manner, the transceiver 520 may receive an incoming OTA signal from the antenna structure 512 through the duplexer 516. The transceiver 520 may process and send the incoming signal to the processor 524 for further processing.

In various embodiments, the antenna structure 512 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

Those skilled in the art will recognize that the wireless communication device 500 is given by way of example and that, for simplicity and clarity, only so much of the construction and operation of the wireless communication device 500 as is necessary for an understanding of the embodiments is shown and described. Various embodiments contemplate any suitable component or combination of components performing any suitable tasks in association with wireless communication device 500, according to particular needs. Moreover, it is understood that the wireless communication device 500 should not be construed to limit the types of devices in which embodiments may be implemented.

EXAMPLES

Some non-limiting examples include:

Example 1 may include a semiconductor component comprising: a barrier layer; a gallium nitride (GaN) channel layer having a Ga-face coupled with the barrier layer; and a thermoconductive layer within 1000 nanometers of the Ga-face of the GaN channel layer, wherein the thermoconductive layer has a thermal conductivity value of at least 500 W/(m·K) and is closer to an N-face of the GaN channel layer than to the Ga-face of the GaN channel layer.

Example 2 may include the subject matter of Example 1, further comprising: a dielectric layer between the GaN channel layer and the thermoconductive layer.

Example 3 may include the subject matter of any one of Examples 1-2, further comprising: a thermoconductive carrier mounting layer coupled with the thermoconductive layer, wherein the thermoconductive carrier mounting layer has a thermal conductivity value of at least 500 W/(m·K).

Example 4 may include the subject matter of any one of Examples 1-3, further comprising: a GaN cap layer, wherein the GaN cap layer is coupled with the barrier layer.

Example 5 may include the subject matter of any one of Examples 1-4, further comprising: a back barrier layer between the GaN channel layer and the thermoconductive layer.

Example 6 may include the subject matter of Example 5, further comprising a dielectric layer between the back barrier layer and the thermoconductive layer.

Example 7 may include the subject matter of any one of Examples 4-6, further comprising an activation layer coupled with a Ga-face of the GaN cap layer, the activation layer including a gate, a source, and a drain.

Example 8 may include the subject matter of any one of Examples 1-7, further comprising a thermoconductive carrier mounting layer coupled with the thermoconductive layer, wherein the thermoconductive carrier mounting layer has a thermal conductivity value of at least 500 W/(m·K).

Example 9 may include the subject matter of Example 8, wherein the thermoconductive layer and the thermoconductive carrier mounting layer are formed of a diamond based material.

Example 10 may include the subject matter of any one of Examples 1-9, wherein the thermoconductive layer is within 500 nanometers of the Ga-face of the GaN channel layer.

Example 11 may include a method of fabricating a semiconductor component comprising: forming an N-face barrier layer; forming an N-face gallium nitride (GaN) channel layer on the N-face barrier layer; and forming a thermoconductive layer within 1000 nanometers of the N-face GaN channel layer, wherein the thermoconductive layer has a thermal conductivity of at least 500 W/(m·K).

Example 12 may include the subject matter of Example 11, further comprising before forming the N-face barrier layer, forming an N-face GaN cap layer, wherein the N-face barrier layer is formed on the N-face GaN cap layer.

Example 13 may include the subject matter of Example 12, further comprising: providing a substrate; forming an N-face nucleation layer on the substrate before forming the N-face GaN cap layer; forming an N-face buffer layer on the N-face nucleation layer, wherein the N-face GaN cap layer is formed above the N-face buffer layer; and removing the substrate, N-face nucleation layer, and N-face buffer layer to expose a Ga-face of the N-face GaN cap layer.

Example 14 may include the subject matter of Example 13, further comprising forming a release layer on the N-face buffer layer, wherein forming the N-face GaN cap layer above the N-face nucleation layer includes forming the N-face GaN cap layer on the release layer, and wherein removing the substrate, N-face nucleation layer, and N-face buffer layer includes etching the release layer.

Example 15 may include the subject matter of any one of Examples 11-14, further comprising forming a back barrier layer on the N-face GaN channel layer.

Example 16 may include the subject matter of Example 15, further comprising forming a dielectric layer on the back barrier layer, wherein forming the thermoconductive layer includes forming the thermoconductive layer on the dielectric layer.

Example 17 may include the subject matter of any one of Examples 11-16, further comprising coupling a thermoconductive carrier mounting layer to the thermoconductive layer, wherein the thermoconductive carrier mounting layer has a thermal conductivity of at least 500 W/(m·K).

Example 18 may include the subject matter of any one of Examples 13-17, further comprising forming an activation layer on the Ga-face of the N-face GaN cap layer, the activation layer including a gate, a source, and a drain.

Example 19 may include the subject matter of any one of Examples 11-15, further comprising forming a dielectric layer above the N-face GaN channel layer, wherein forming the thermoconductive layer includes forming the thermoconductive layer on the dielectric layer.

Example 20 may include the subject matter of any one of Examples 11-15, further comprising forming a dielectric layer on the N-face GaN channel layer, wherein forming the thermoconductive layer includes forming the thermoconductive layer on the dielectric layer.

Example 21 may include the subject matter of any one of Examples 11-17, further comprising forming an activation layer on a Ga-face of the N-face GaN cap layer, the activation layer including a gate, a source, and a drain.

Example 22 may include the subject matter of any one of Examples 11-21, wherein the thermoconductive layer is formed of diamond, boron nitride, graphene, graphite, or cubic boron arsenide.

Example 23 may include the subject matter of any one of Examples 13-19, wherein the thermoconductive layer is formed of diamond, the N-face nucleation layer is formed of aluminum nitride (AlN), and the N-face buffer layer is formed of GaN.

Example 24 may include semiconductor component prepared by a process comprising: forming an N-face barrier layer; forming an N-face gallium nitride (GaN) channel layer on the N-face barrier layer; and forming a thermoconductive layer within 1000 nanometers of the N-face GaN channel layer, wherein the thermoconductive layer has a thermal conductivity of at least 500 W/(m·K).

Example 25 may include the subject matter of Example 24 wherein the process further comprises: providing a substrate; forming an N-face nucleation layer on the substrate; forming an N-face buffer layer on the N-face nucleation layer; forming an N-face GaN cap layer above the N-face buffer layer, wherein the N-face barrier layer is formed on the N-face GaN cap layer; removing the substrate, N-face nucleation layer, and N-face buffer layer to expose a Ga-face of the N-face GaN cap layer; and forming an activation layer on the Ga-face of the N-face GaN cap layer, the activation layer including a gate, a source, and a drain.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments shown and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. A semiconductor component comprising:
   a barrier layer;
   a gallium nitride (GaN) channel layer having a Ga-face coupled with the barrier layer; and
   a thermoconductive layer within 1000 nanometers of the Ga-face of the GaN channel layer, wherein the thermoconductive layer has a thermal conductivity value of at least 500 W/(m·K) and is closer to an N-face of the GaN channel layer than to the Ga-face of the GaN channel layer.

2. The semiconductor component of claim 1, further comprising:
   a dielectric layer between the GaN channel layer and the thermoconductive layer.

3. The semiconductor component of claim 1, further comprising:
   a thermoconductive carrier mounting layer coupled with the thermoconductive layer, wherein the thermoconductive carrier mounting layer has a thermal conductivity value of at least 500 W/(m·K).

4. The semiconductor component of claim 1, further comprising:
   a GaN cap layer, wherein the GaN cap layer is coupled with the barrier layer.

5. The semiconductor component of claim 4, further comprising:
   a back barrier layer between the GaN channel layer and the thermoconductive layer.

6. The semiconductor component of claim 5, further comprising a dielectric layer between the back barrier layer and the thermoconductive layer.

7. The semiconductor component of claim 6, further comprising an activation layer coupled with a Ga-face of the GaN cap layer, the activation layer including a gate, a source, and a drain.

8. The semiconductor component of claim 7, further comprising a thermoconductive carrier mounting layer coupled with the thermoconductive layer, wherein the thermoconductive carrier mounting layer has a thermal conductivity value of at least 500 W/(m·K).

9. The semiconductor component of claim 8, wherein the thermoconductive layer and the thermoconductive carrier mounting layer are formed of a diamond based material.

10. The semiconductor component of claim 1, wherein the thermoconductive layer is within 500 nanometers of the Ga-face of the GaN channel layer.

11. A method of fabricating a semiconductor component comprising:
    forming an N-face barrier layer;
    forming an N-face gallium nitride (GaN) channel layer on the N-face barrier layer; and
    forming a thermoconductive layer within 1000 nanometers of the N-face GaN channel layer, wherein the thermoconductive layer has a thermal conductivity of at least 500 W/(m·K).

12. The method of claim 11, further comprising before forming the N-face barrier layer, forming an N-face GaN cap layer, wherein the N-face barrier layer is formed on the N-face GaN cap layer.

13. The method of claim 12, further comprising:
    providing a substrate;
    forming an N-face nucleation layer on the substrate before forming the N-face GaN cap layer;
    forming an N-face buffer layer on the N-face nucleation layer, wherein the N-face GaN cap layer is formed above the N-face buffer layer; and
    removing the substrate, N-face nucleation layer, and N-face buffer layer to expose a Ga-face of the N-face GaN cap layer.

14. The method of claim 12, further comprising forming a dielectric layer on the N-face GaN channel layer, wherein forming the thermoconductive layer includes forming the thermoconductive layer on the dielectric layer.

15. The method of claim 12, further comprising forming an activation layer on a Ga-face of the N-face GaN cap layer, the activation layer including a gate, a source, and a drain.

16. The method of claim 12, wherein the thermoconductive layer is formed of diamond, boron nitride, graphene, graphite, or cubic boron arsenide.

17. The method of claim 13, further comprising forming a release layer on the N-face buffer layer, wherein forming the N-face GaN cap layer above the N-face nucleation layer includes forming the N-face GaN cap layer on the release layer, and wherein removing the substrate, N-face nucleation layer, and N-face buffer layer includes etching the release layer.

18. The method of claim 13, further comprising forming a dielectric layer above the N-face GaN channel layer, wherein forming the thermoconductive layer includes forming the thermoconductive layer on the dielectric layer.

19. The method of claim 13, wherein the thermoconductive layer is formed of diamond, the N-face nucleation layer is formed of aluminum nitride (AlN), and the N-face buffer layer is formed of GaN.

20. The method of claim 17, further comprising forming a back barrier layer on the N-face GaN channel layer.

21. The method of claim 20, further comprising forming a dielectric layer on the back barrier layer, wherein forming the thermoconductive layer includes forming the thermoconductive layer on the dielectric layer.

22. The method of claim 21, further comprising coupling a thermoconductive carrier mounting layer to the thermoconductive layer, wherein the thermoconductive carrier mounting layer has a thermal conductivity of at least 500 W/(m·K).

23. The method of claim 22, further comprising forming an activation layer on the Ga-face of the N-face GaN cap layer, the activation layer including a gate, a source, and a drain.

* * * * *